(12) United States Patent
Helton

(10) Patent No.: US 11,543,014 B2
(45) Date of Patent: Jan. 3, 2023

(54) MATCHED EQUILIBRIUM GEAR MECHANISM

(71) Applicant: Justin R. Helton, Fredericksburg, VA (US)

(72) Inventor: Justin R. Helton, Fredericksburg, VA (US)

(73) Assignee: United States of America, as represented by the Secretary of the Navy, Arlington, VA (US)

( * ) Notice: Subject to any disclaimer, the term of this patent is extended or adjusted under 35 U.S.C. 154(b) by 66 days.

(21) Appl. No.: 16/851,398

(22) Filed: Apr. 17, 2020

(65) Prior Publication Data

US 2020/0378488 A1 Dec. 3, 2020

Related U.S. Application Data

(60) Provisional application No. 62/855,262, filed on May 31, 2019.

(51) Int. Cl.
*F16H 57/00* (2012.01)
*G01M 1/12* (2006.01)
*B23F 15/00* (2006.01)
*F16H 19/00* (2006.01)

(52) U.S. Cl.
CPC .............. *F16H 57/00* (2013.01); *B23F 15/00* (2013.01); *G01M 1/12* (2013.01); *F16H 19/001* (2013.01); *F16H 2057/0087* (2013.01); *Y10T 29/49476* (2015.01)

(58) Field of Classification Search
CPC ......... Y10T 29/49462; Y10T 29/49467; Y10T 29/49476; F16H 57/00; F16H 19/001; F16H 2057/0087; F16H 2035/003; B23F 15/00; G01M 1/12; G06F 30/17; G05B 19/186
USPC .................................. 29/893, 893.3, 893.35
See application file for complete search history.

(56) References Cited

U.S. PATENT DOCUMENTS

| | | | |
|---|---|---|---|
| 10,955,213 B1 * | 3/2021 | Nathan | F41A 27/26 |
| 2016/0375587 A1 * | 12/2016 | Louveau | F16H 19/005 74/405 |
| 2017/0276219 A1 * | 9/2017 | Kubo | F16H 55/0886 |
| 2019/0293156 A1 * | 9/2019 | Kawanami | F16H 35/00 |

* cited by examiner

*Primary Examiner* — Sarang Afzali
*Assistant Examiner* — Darrell C Ford
(74) *Attorney, Agent, or Firm* — Gerhard W. Thielman

(57) ABSTRACT

A method is provided for producing gears to balance counteracting gravity moment and a torque equilibrator across an elevation range. The method includes assigning a value to summation of pitch radii of the first and second non-circular gears; calculating a torque for both the non-circular gears for an angle within the elevation range; calculating a first pitch radius of the first non-circular gear by the gravity moment and the torsion equilibrator; calculating a second pitch radius of the second non-circular gear from the summation; and fabricating the non-circular gears based on the first and second pitch radii.

4 Claims, 9 Drawing Sheets

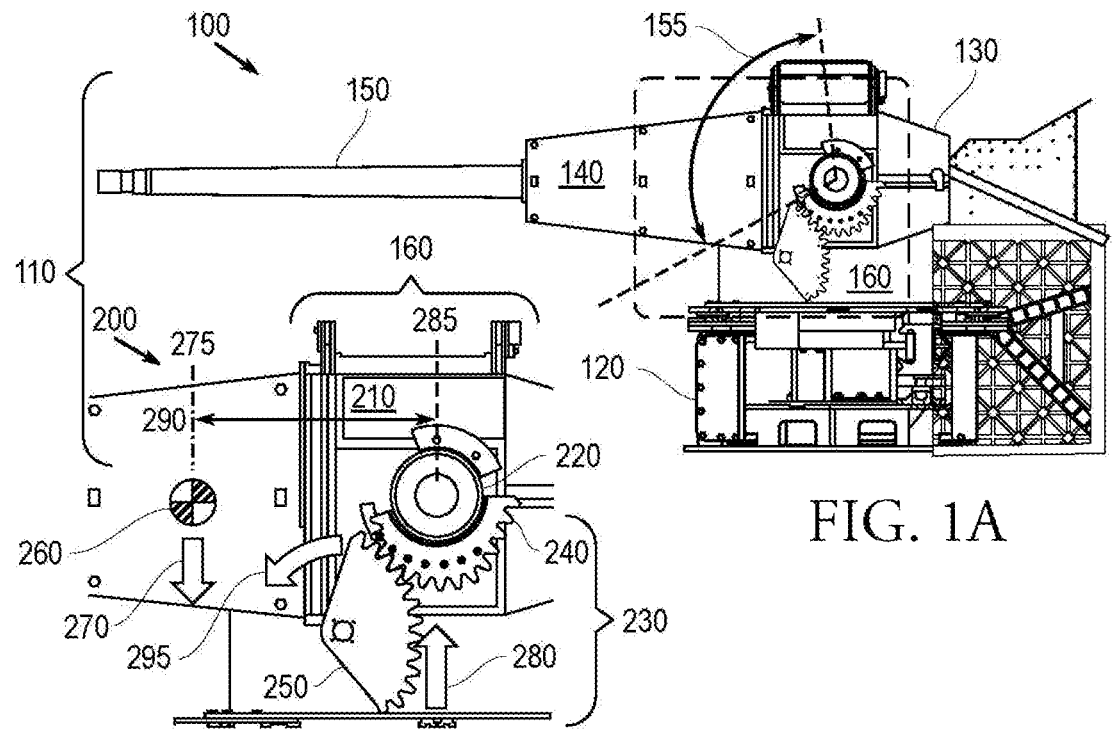
FIG. 1A
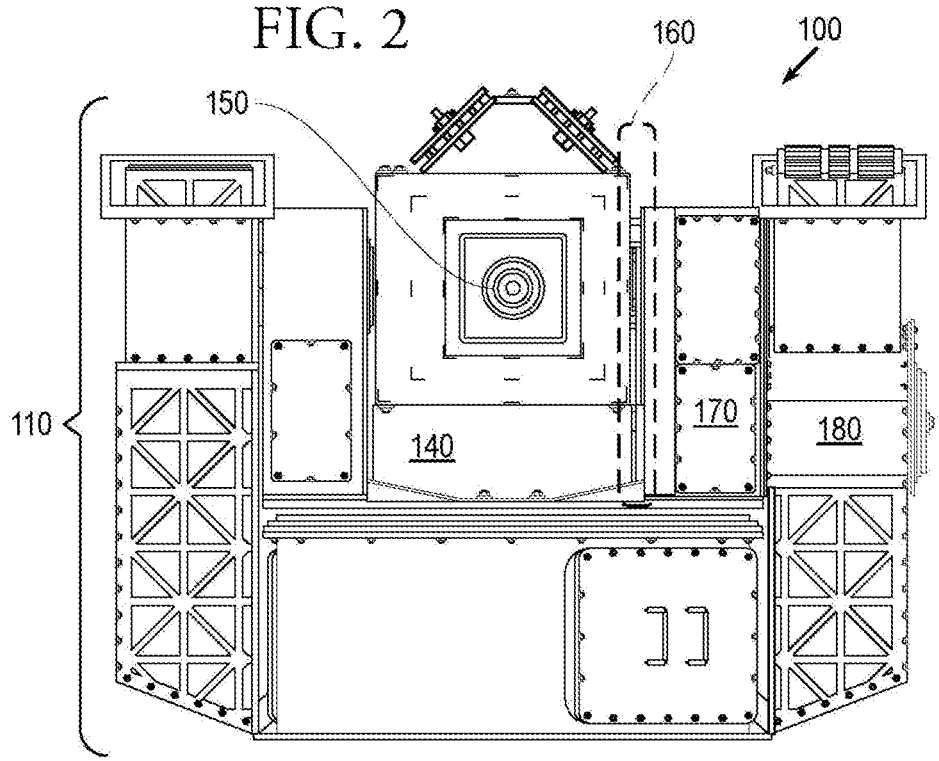
FIG. 2
FIG. 1B

FIG. 7

```
clear all
%max theta 1 in degrees
h=85;

%minimum theta 1 in degrees
l=-35;

%Array of theta points from 0 to h
theta= 0:0.00174533:h*.0174533;

%weight in lbs
w=611;

%center to center distance
c2c=15;

%distance from CG to center of rotation
d=17.65;

%spring constant in in-lbs/degree
kin=90;

%spring constant in in-lbs/radian
k=kin/.0174533;

%intialize torque 2
t2=zeros(1,h*10+1);

%initializes torque 1, torque 2, theta
2, radius 1, radius 2. Radius 1 =
%radius 2 is enforced here
to start the shape
 t1(1)=w*d*cos(theta(1));
 t2(1)=t1(1);
 theta2(1)=0;
 r1(1)=(t1(1)/t2(1))*c2c/(1+t1(1)/t2(1));
 r2(1)=c2c-r1(1);

%preload required for r1=r2 @
theta1=theta2=0
p=t2(1)/k;

for m=2:h*10+1;
%calculates theta 2 based off the ratios
of the radii
    theta2(m)=.00174533*r1(m-1)/r2(m1)
+theta2(m-1);
    %calculates torque2 based off the
preload-current theta2 value t2(m)=k*(p-theta2(m));
    %calculates torque1 due to gravity
    t1(m)=w*d*cos(theta(m));

%calculates radius 1 that matches
torque 1 to torque 2 (mapping spring
    %to gravity r1(m)=(t1(m)/t2(m))*c2c/(1+t1(m)/t2(m));

%if r1 is known r2 can be found
    r2(m)=c2c-r1(m);

%check to see that the torques are
canceling each other out
    t_tot(m)=t1(m)-t2(m)*r1(m)/r2(m);
    end
%shows theta2 in degrees (sanity check)
theta2_deg=theta2./.0174533;

%this section repeats the above calculations
for 0 to -35 degrees with new
%variables with the suffix 'n' thetan=0:-0.00174533:l*.0174533;

t1n(1)=w*d*cos(thetan(1));
t2n(1)=t1n(1);
theta2n(1)=0;
r1n(1)=(t1n(1)/t2n(1))*c2c/(1+t1n(1)/t2n(1));

r2n(1)=c2c-r1n(1);

for m=2:abs(l)*10+1;

theta2n(m)=-.00174533*r1n(m-1)/r2n(m-1)+theta2n(m-1);

t2n(m)=k*(p-theta2n(m));

t1n(m)=w*d*cos(thetan(m));

r1n(m)=(t1n(m)/t2n(m))*c2c/(1+t1n(m)/t2n(m));

r2n(m)=c2c-r1n(m);

t_ton(m)=t1n(m)-t2n(m)*r1n(m)/r2n(m);
end
%calculates full range for the torsion spring
range_deg=(p-theta2n(351))/.0174533

%displays theta1 and theta 2 in degrees
theta2n_deg=theta2n./.0174533;
theta_deg=theta./.0174533;

%plots gear shapes ( can be gear 1 or 2,
positive or negative theta values)
  %polar(theta2,r2);
  polar(theta2,r2);
  %polar(thetan,r1n);
    %polar(theta2,r2);
```

700

MATCHED EQUILIBRIUM GEAR MECHANISM

Pursuant to 35 U.S.C. § 119, the benefit of priority from provisional application 62/855,262, with a filing date of May 31, 2019, is claimed for this non-provisional application.

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to gear mechanisms. In particular, the invention relates to design of gears to balance counteracting moments from a gravitational cantilever and a torsion equilibrator.

Artillery represents long-range guns, which include platform section that includes a breech loader and aiming mechanism together with a barrel from which to fire ammunition rounds. Due to the cantilevered mass of the barrel, the center of mass and rotation pivot axis can be separated by a distance that imposes torque.

SUMMARY

Conventional gear mechanisms yield disadvantages addressed by various exemplary embodiments of the present invention. In particular, various exemplary embodiments provide non-linear matching of the gravity torque to enable neutral buoyancy for a rotational body. That neutral buoyancy facilitates more agile motion response for improved system control. Exemplary embodiments provide a method for producing gears to balance counteracting gravity moment and a torque equilibrator across an elevation range.

The exemplary method includes assigning a value to summation of pitch radii of the first and second non-circular gears; calculating a torque for both the non-circular gears for an angle within the elevation range; calculating a first pitch radius of the first non-circular gear by the gravity moment and the torsion equilibrator; calculating a second pitch radius of the second non-circular gear from the summation; and fabricating the non-circular gears based on the first and second pitch radii.

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIGS. 1A and 1B are elevation views of a gun system;
FIG. 2 is an elevation detail view of the gun system;
FIG. 7 is a text view of design code for gear shaping.

DETAILED DESCRIPTION

Figure 3A:
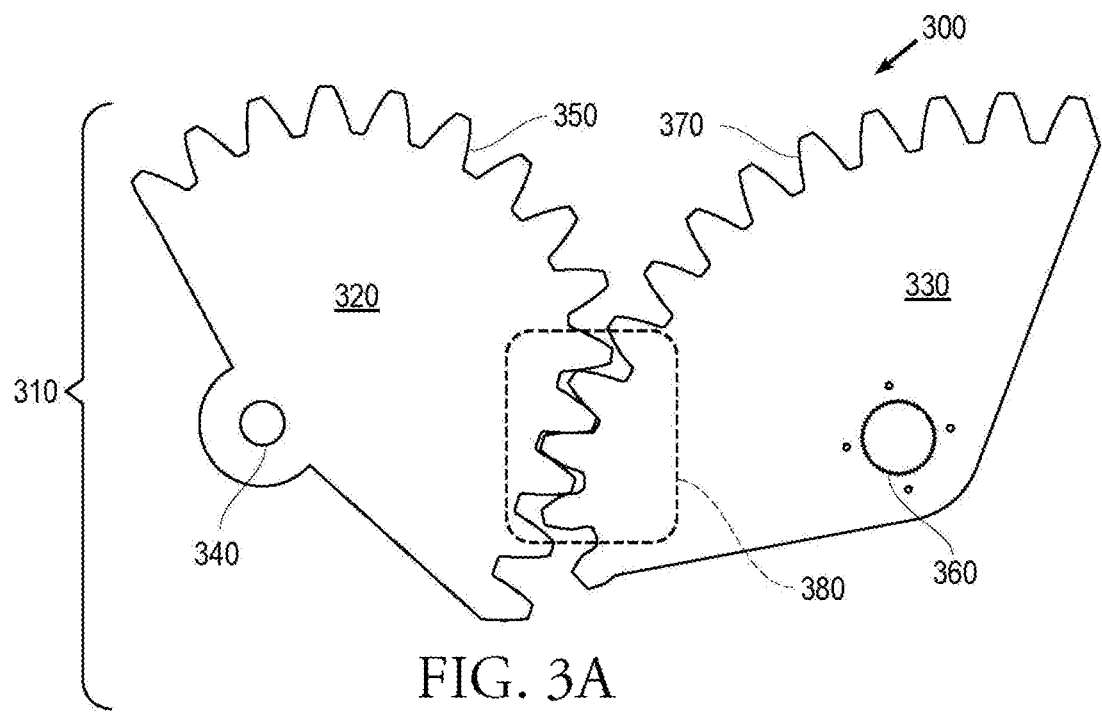
FIGS. 3A and 3B are schematic and design views of a gearing arrangement with proximal and distal gears.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

The disclosure generally employs metric units with the following abbreviations: length in millimeters (mm), inches (") or feet ('), mass in pounds-mass ($lb_m$), force in pounds-force time ($lb_f$), and angles in degrees (°) or radians (rad). Supplemental measures can be derived from these, such as torque in foot-pounds ($ft\text{-}lb_f$), and the like.

Exemplary embodiments provide two non-circular gears associated with a torsion spring to match by equilibrium the non-linear torque due gravity applied to a gun mount from the rotor mass being significantly out of balance. This means that axis of rotation of a motor is not coincident with the center of mass of the rotating body—a condition that exemplary embodiments compensate for.

FIGS. 1A and 1B show elevation views 100 of a gun system 110, including a base 120, an aft housing 130 and a forward housing 140 that encloses a barrel 150. The gun system 110 can be pivoted across an approximately 85° range of elevations 155. A dash envelope 160 includes a mid-section for adjusting elevation. FIG. 1A shows the gun system 110 from port side, while FIG. 1B features these elements from the front. A port housing 170 (shown to the right of the barrel 150) interacts with a gearing system. A box 180 adjacent the port housing 170 houses an equilibrator for counterbalance.

FIG. 2 shows an elevation detail view 200 of the dash envelope 160 for a mid-section housing 210. An elevation trunnion 220 rotates the gun system 110 to elevate the barrel 150. An exemplary gearing mechanism 230 includes a proximal gear 240 and a distal gear 250, their distinctions in relation to the trunnion 220. The gun system 110 has a center of mass 260 that experiences gravitational force 270 downward along a gravity axis 275. The proximal and distal gears 240 and 250 are composed of 17-4 PH steel.

The design torque profile at all locations (opposite gravity torque) involves two constraints: maximum at 0° elevation, and equal at −30° and +30° elevation. Transmission variables can be mapped at every location to map linear torque to the desired torque. The transmission variable can be correlated to the ratio of the radii of the proximate gear 240 to the distal gear 250. In this manner, exemplary embodiments provide geometries for gears 240 and 250 that minimize applied torque across the range of elevations 155.

The trunnion 220 resists all linear motion in the vertical plane, permitting free rotation perpendicular to the support axis 285. Due to the cantilever mass of the barrel 150 that shifts the center of mass 260, a moment arm gap 290 of 17.65" separates axes 275 and 285. This gap 290 (between mass and pivot centers) imparts a moment or torque 295 to the trunnion 220 against which to elevate the gun system 110. A torsion spring 645 counteracts this torque 295 as trim to maintain the barrel 150 in position. This torque can be applied to the housing 210 anywhere, but it is most relevant when placed at the trunnion 220. This helical equilibrator spring 645 is composed of 5000-series steel (or alternatively PH stainless steel) has nineteen turns with outer coil diameter of 6.5" and length of 22", applying a maximum of 1050 ft-lb$_f$ torque.

A prototype 30 mm gun incorporates a trainable mount with elevation angles across a range 155 up to 85°, and is designed to rotate about its ammunition feed system. The center of mass 260 has a gap 290 approximately 17.65" from the center of rotation at the trunnion 220, inducing significant torque 295 to be applied to the rotor mass due to gravity 270.

Figure 3B:
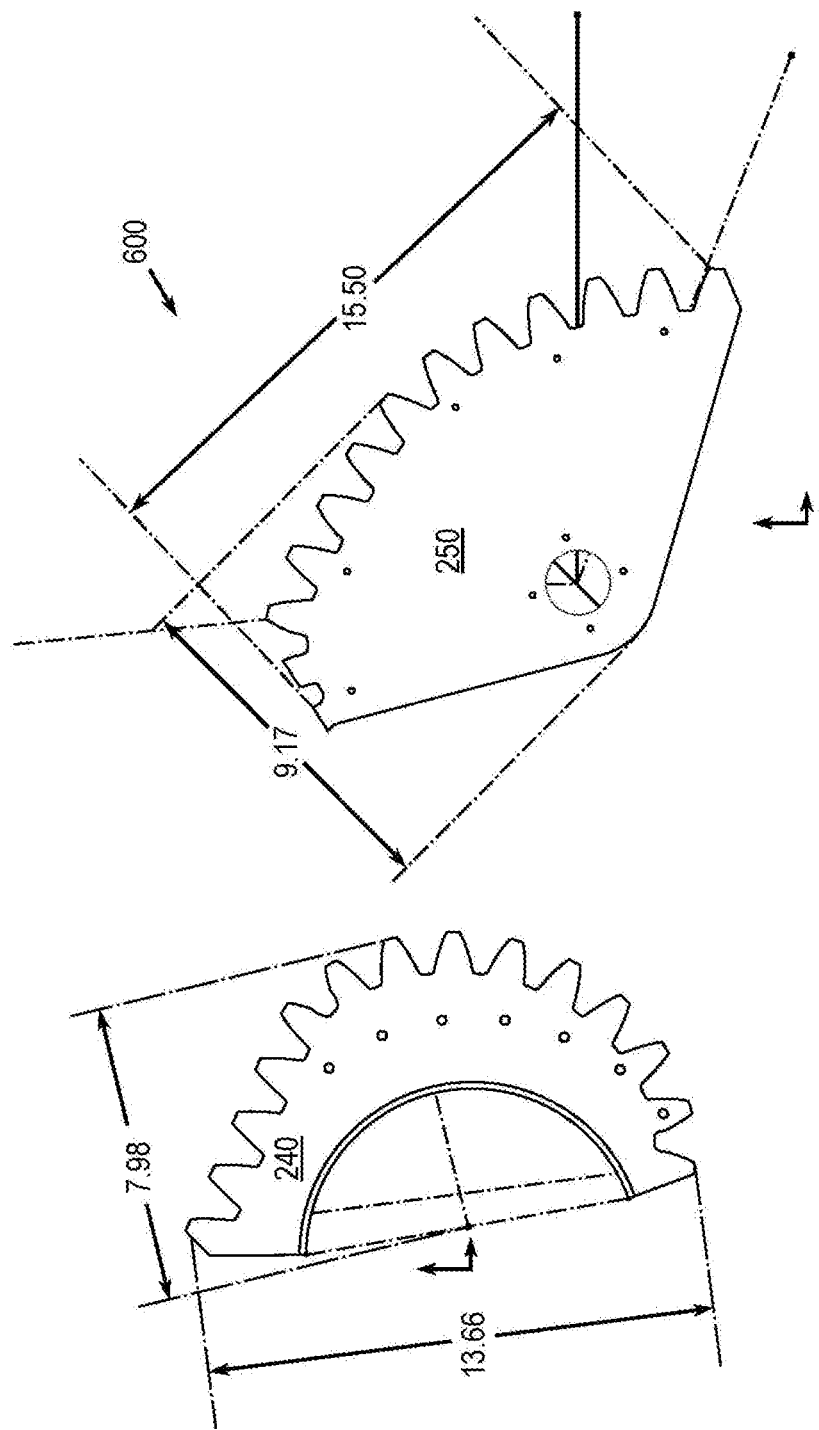

FIG. 3A shows an elevation view 300 of an exemplary gearing arrangement 310 in relation to the gear system 230. This arrangement 310 includes a left (fore) gear 320 and a right (aft) gear 330. The left gear 320 includes a left shaft hole 340 and extends across an arc with left teeth 350 along its periphery. The right gear 330 includes a right shaft hole 360 and extends across a right arc with right teeth 370. The teeth 350 and 370 mesh, as shown within a dash envelope 380. FIG. 3B shows a diagram view 390 of the proximal and distal gears 240 and 250. For the proximal gear 240, width is about eight inches and length is almost fourteen inches. For the distal gear 250, width is about nine inches and length is between fifteen and sixteen inches.

Figures 4, 5:
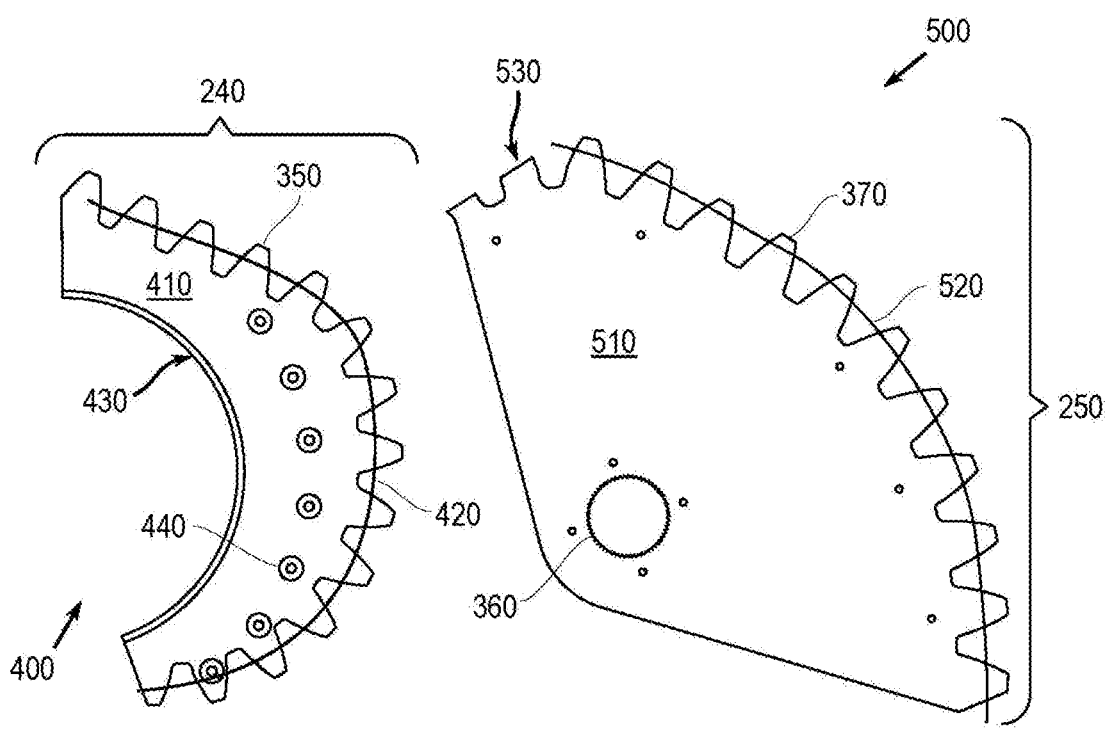
FIG. 4 is an elevation view of the proximal gear.
FIG. 5 is an elevation view of the distal gear.

FIG. 4 shows an elevation view 400 of the proximal gear 240, with a profile analogous to the left gear 320. The gear 240 includes an arc frame 410 that secures its peripheral left teeth 350 that align along a proximal pitch line 420. An inner arc 430 avoids interference with the trunnion 220, and attach holes 440 enable engagement with associated mounting hardware. For the 30 mm gun, the proximal gear is 0.65" thick.

FIG. 5 shows an elevation view 500 of the distal gear 250, with a profile analogous to the right gear 330. The gear 250 includes an arc frame 510 that secures its peripheral left teeth 370 along a distal pitch line 520 with a truncated edge 530 and the shaft hole 360. For the 30 mm gun, the distal gear is 0.5" thick. The proximal gear 240 is thicker than the distal gear 250 due to the manner in which assembly 230 attaches, as there is slight variation in the in-plane alignment.

Figure 6A:
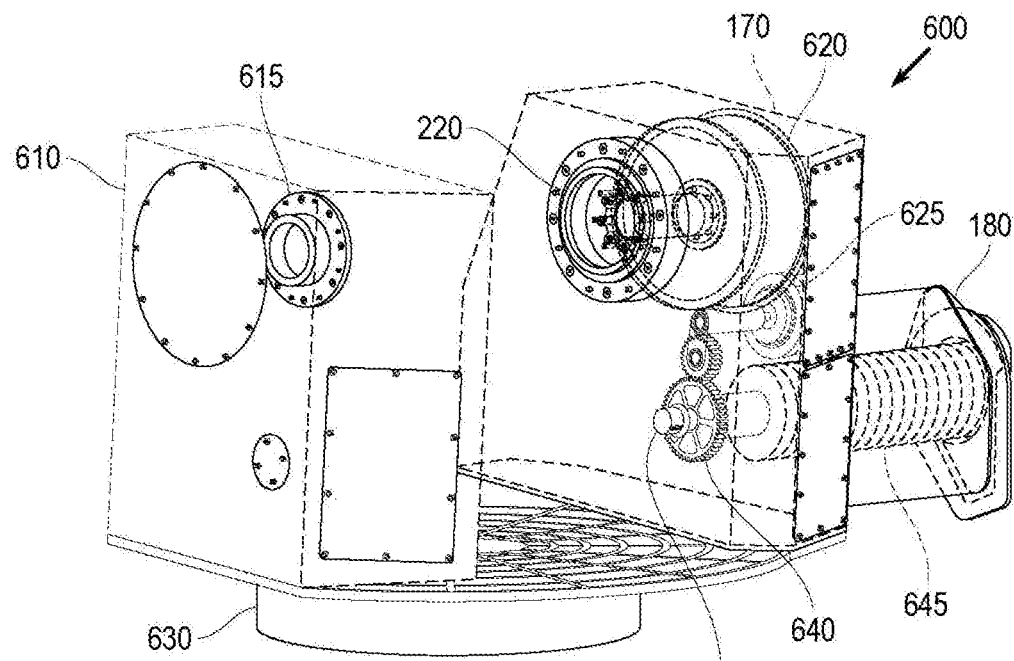
FIGS. 6A, 6B and 6C are perspective or elevation views of torsion mechanisms on the gun system.
Figure 6B:
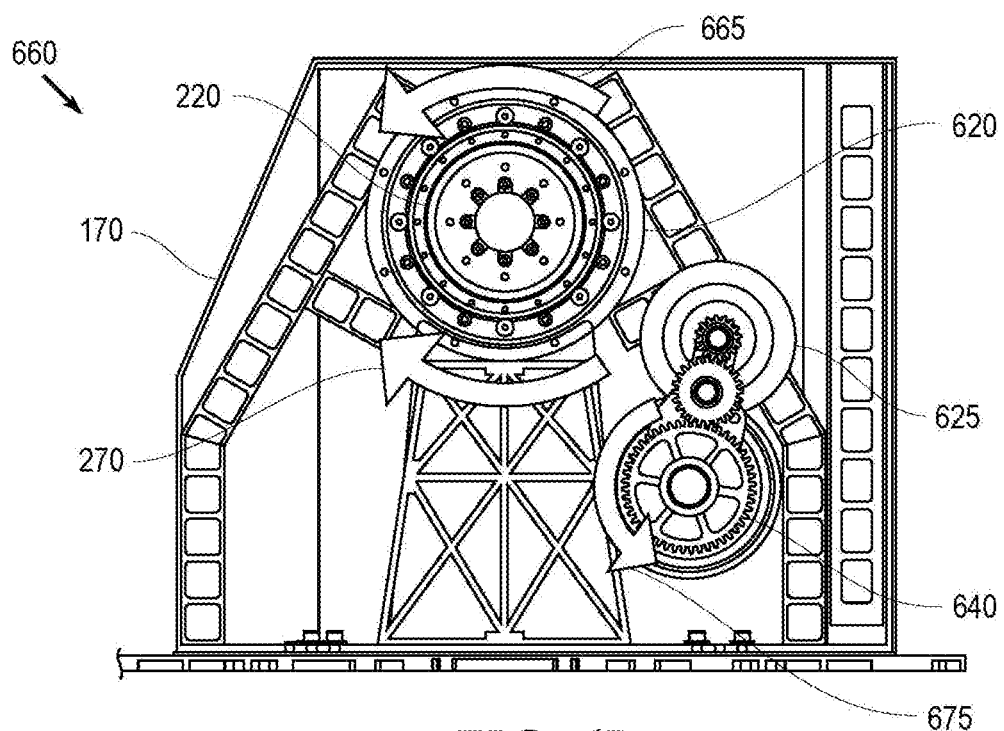
Figure 6C:
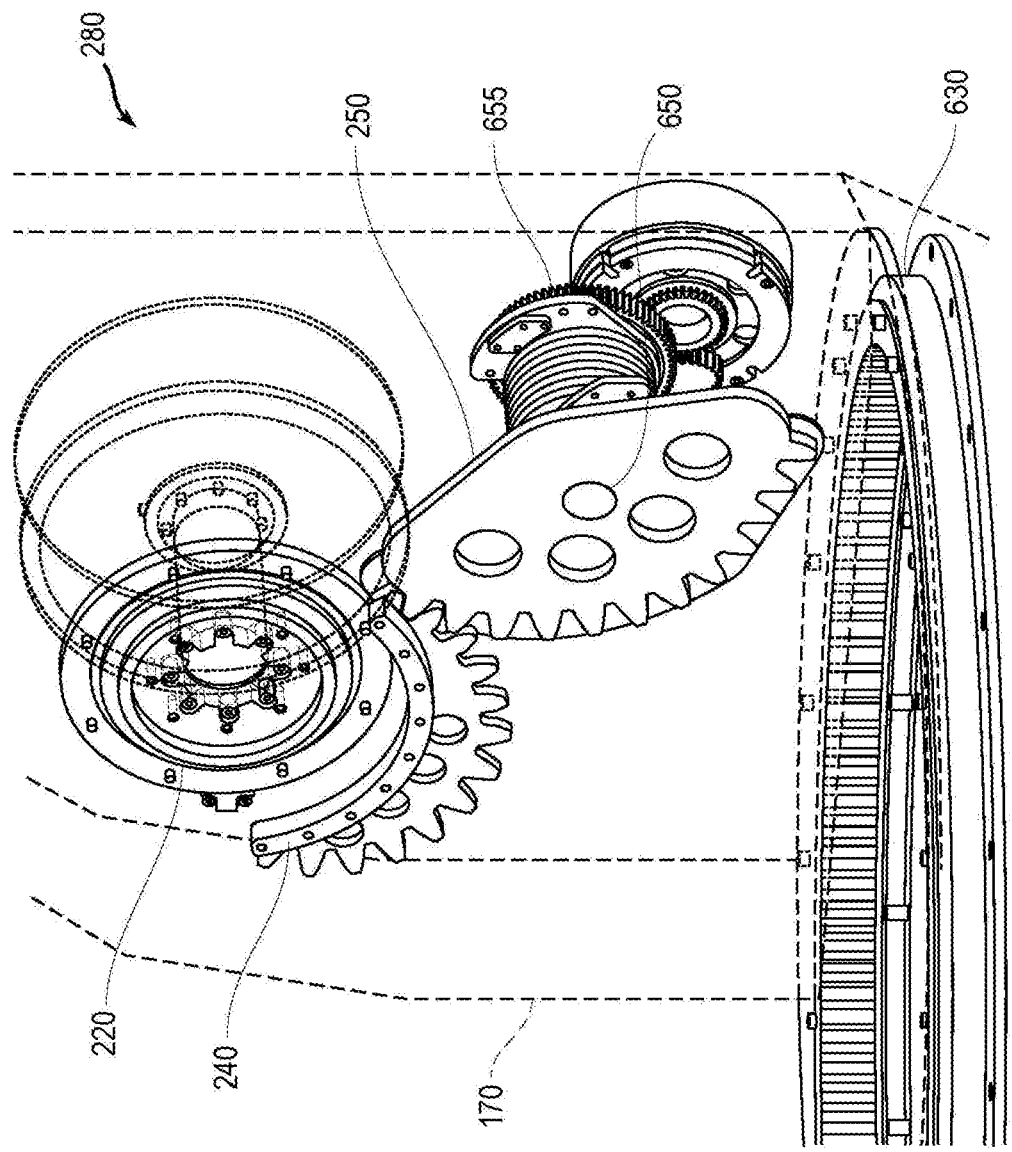

FIG. 6A shows a perspective view 600 of the port housing 170 and a starboard housing 210 that flank the barrel 150 (omitted). The starboard housing 210 includes a tapered collar bearing 215 opposite the trunnion 220 powered by a direct drive motor 220 that connects to an emergency brake 625. The housings 170 and 210 are supported by a horizontal pedestal 630. Through an involute spline 640, an equilibrator torsion spring 645 contained within the box 180 connects to a spring shaft 650. FIG. 6B shows an elevation view 660 of the port housing 170. The drive motor 620 imparts clockwise torque 665 on the trunnion 220 to overcome the anticlockwise torque 670 from the barrel 150, which is countered by variable clockwise torque 675 via the spring 645 at the spline 640. FIG. 6C shows a detail perspective view 680 of the port housing 170 with gears 240 and 250 as the gearing mechanism 230 that connects torque from the spring 645 through the shaft 650 to the trunnion 220.

Figure 8:
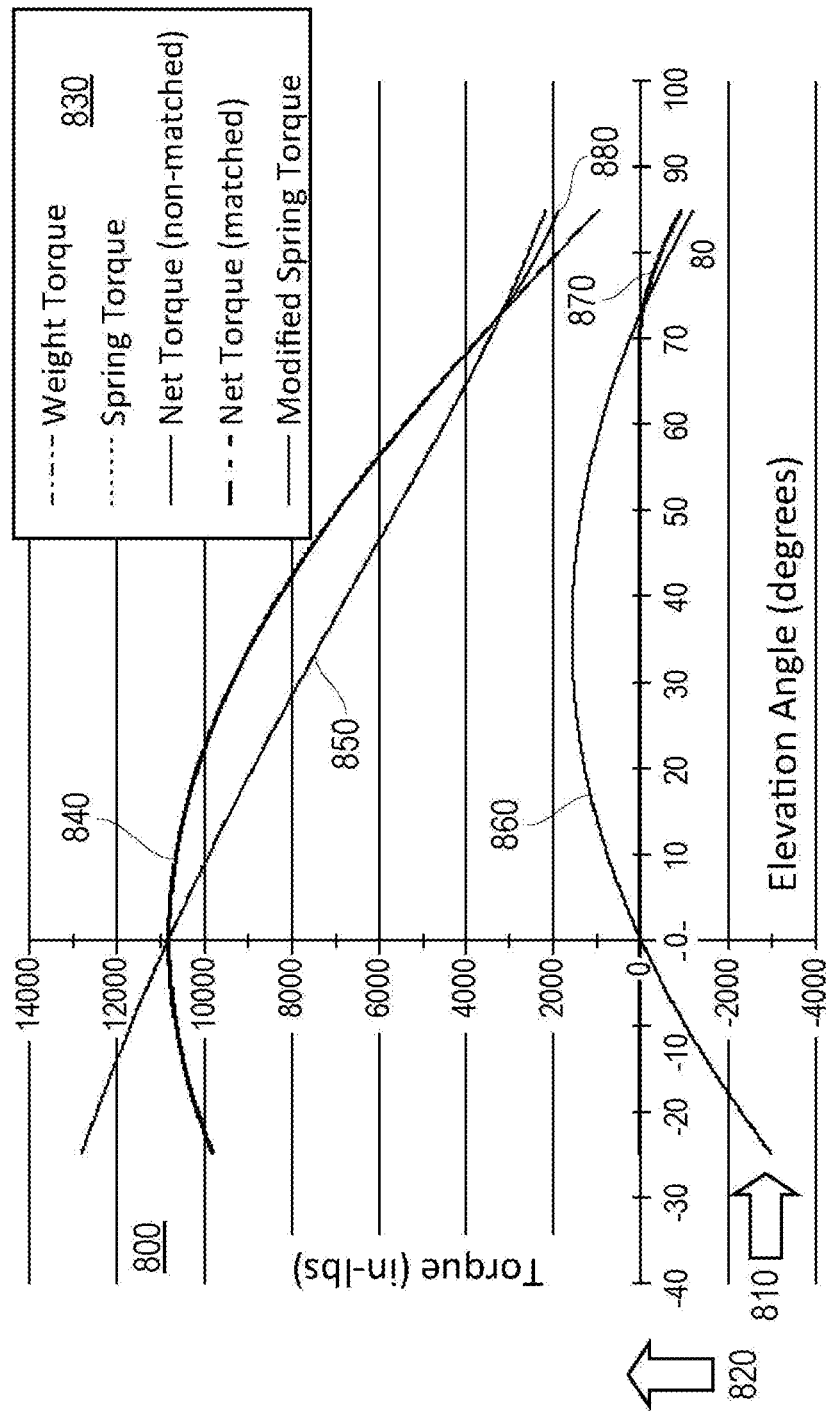

FIG. 7 shows a text view 700 of a MATLAB® code used to generate gear shapes determined by a piece-wise calculation of the pitch lines (radius versus angle) of two gears to balance the torque due to a spring and the torque due to gravity. The relations described subsequently. FIG. 8 shows a graphical view 800 of torque variation with elevation. Elevation 810 (degrees) across angle range 155 denotes the abscissa, and torque 820 (in-lb$_f$) represents the ordinate. A legend 830 identifies weight torque 840, spring torque 850, non-matched net torque 860, matched net torque 870 and modified spring torque 880, which follows the weight torque 840 until exceeding 74° elevation. The matched net torque 870 remains at zero until reaching 70° elevation. The weight torque 840 exhibits an inverted parabolic profile, with its peak of about 900 ft-lb$_f$ at 0° elevation. The matched net torque 880 is substantially zero from elevation angles ranging from −25° to 70° and remains low even to 85°.

Exemplary embodiments provide advantages to spring balancing of moving components by matching the gravity induced torque versus angle. This can enhance several applications, including but not limited to artillery platforms, rail gun mounts, and robotic arms. In a conventionally balanced system utilizing an equilibrator, a torsion spring counters the gravity induced torque 295. This depends on the angular location being based on the cross product between the moment arm support force 280 and the gravity force 270, which has a sinusoidal relationship with respect to pointing angle.

A torsion spring, whether traditional or constant torque, provides linear torque with respect to angle. The result mitigates a sinusoidal torque curve by subtracting out a straight line. The results of this can be seen in view 900, and these eliminate the majority of the torque 295, leaving however a significant amount that change directions depending on angle.

This residual bias torque reduces controllability and imposes the trunnion 220 towards two separate bias rest positions, rather than remaining neutral at an established elevation setting for the barrel 150. Hence, the residual bias torque should be counteracted by a motor to hold position, and this also degrades the acceleration of the gun system 110. Utilizing an exemplary matched equilibration design, such as the gearing mechanism 230, creates a neutral balance over the majority of the angular envelop, which in turn maximizes the acceleration capability of the gun system 110 for a given motor.

Exemplary embodiments provide a gear mechanism 230 that includes non-circular gears prescribe the torque 295 transmitted to a drive mechanism, such as at the trunnion 220. This enables hump and bias offsets to be smoothed out of the net torque. The resulting torque profile can be seen in view 800. If the torsion spring 645 connects directly to the end effector (e.g., the gun to be pointed), the residual torque would be non-linear and angle dependent due to essentially subtracting the straight line of the spring torque 850 from the sinusoidal curve from the gravity induced torque 295.

The non-circular proximal and distal gears 240 and 250 enable the transfer ratio to be non-linear and angle dependent. The gear shapes are determined by a piece-wise calculation of the pitch lines (radius versus angle) of two gears to balance torques due to a spring and from a cantilever. Gear shapes are cut by piece-wise subtracting an involute spline gear tooth form out of a mass while using the pitch lines as a guide.

The constraints used to synthesize noncircular gears are very simple. The primary constraint is that the center points of the gears do not move. Non-circular gears are constrained by their radial relationships:

$$r_1 + r_2 = C,  \quad (1)$$

where $r_1$ is pitch radius of the proximal gear 240, $r_2$ is pitch radius of the distal gear 250, and C is a constant based on its relationship to the gap 390, for example about ¾ of that moment arm distance. Thus, in eqn. (1) the sum of the two pitch radii remains unchanged, and this must be enforced through the entire range of motion. Note that these pitch radii can vary along their respective arcs, while maintaining the constraint of eqn. (1).

A second constraint is that the chord length of the pitch lines 420 and 520 be identical for both gears 240 and 250. (This chord length corresponds to the linear distance between tooth tips.) This isn't always necessary in terms of noncircular gears—for a radius profile that is repeated, one gear can be an integer value of the other. However, because the exemplary mechanism does not provide full rotation, this second constraint is applied.

Another relationship involves torque and radius with $T_1$ for the proximal gear 240 and $T_2$ for the distal gear 250 by:

$$r_1 T_2 = r_2 T_1, \qquad (2)$$

which can be rewritten as:

$$T_2 = \frac{r_2}{r_1} T_1. \qquad (3)$$

The purpose of using these gears 240 and 250 is to prescribe a torque through the entire range of motion. With the weight torque defined by system geometry and the center-to-center distance chosen by a designer, the remaining variables are $r_1$ as radius-1, $r_2$ as radius-2, torsion spring rate, and torsion spring preload.

Torque transmission is provided in eqn. (3). This is a necessary constraint—otherwise the gears can lose mesh or bind as the pitch lines 420 and 520 separate or interfere. Torque $T_1$ for the proximal gear 240 is defined by the cross-product of the weight and gun vector, forming the gravity moment or torque 295 and written in scalar form as:

$$T_1 = W d \cos \theta_1, \qquad (4)$$

where W is weight, d is the gap 290, and $\theta_1$ is elevation angle. Torque $T_2$ for the distal gear 250 is defined by:

$$T_2 = k(P - \theta_2), \qquad (5)$$

where k is the spring constant, P is the spring preload angle and $\theta_2$ is the angle of twist, which is not the same as the gun's elevation angle.

Combining eqns. (1) and (3) yields the relation:

$$T_2 = \frac{C - r_1}{r_1} T_1. \qquad (6)$$

Substituting eqns. (4) and (6) for the torques and solving for $r_1$ yields:

$$r_1 = \frac{W d \cos \theta_1}{k(P - \theta_2)} \frac{C}{1 + \frac{W d \cos \theta_1}{k(P - \theta_2)}}. \qquad (7)$$

To maintain proper traction between the gears, the local arc length must be held the same, which in turn means that twist angle $\theta_2$ is related to elevation angle $\theta_1$ by the ratios of the radii. This relationship can be seen as:

$$\theta_2 = \frac{r_1}{r_2} \theta_1 = \frac{r_1}{C - r_1} \theta_1. \qquad (8)$$

These relationships work locally, but one must keep track of the previous position to properly calculate the spring torque 850.

Substituting for the twist angle $\theta_2$, one obtains:

$$r_1 = \frac{W d \cos \theta_1}{k\left(P - \frac{r_1}{C - r_1} \theta_1\right)} \frac{Ck\left(P - \frac{r_1}{C - r_1} \theta_1\right)}{k\left(P - \frac{r_1}{C - r_1} \theta_1\right) + W d \cos \theta_1}, \qquad (9)$$

which is a recursive form. Because an integral for this is not readily available, a piece-wise MATLAB® code, shown in view 700, was developed to generate gear pitch lines 420 and 520. Because there are still too many variables to solve for, a few relationships were arbitrarily chosen to complete the solution. Those conditions include:

$$\theta_1 = 0, \theta_2 = 0, \text{ and } T_1 = T_2, \qquad (10)$$

such that the elevation and twist angles are zero, and torques are equal, which from eqn. (3) similarly constrains the pitch radii locally.

Figure 9:
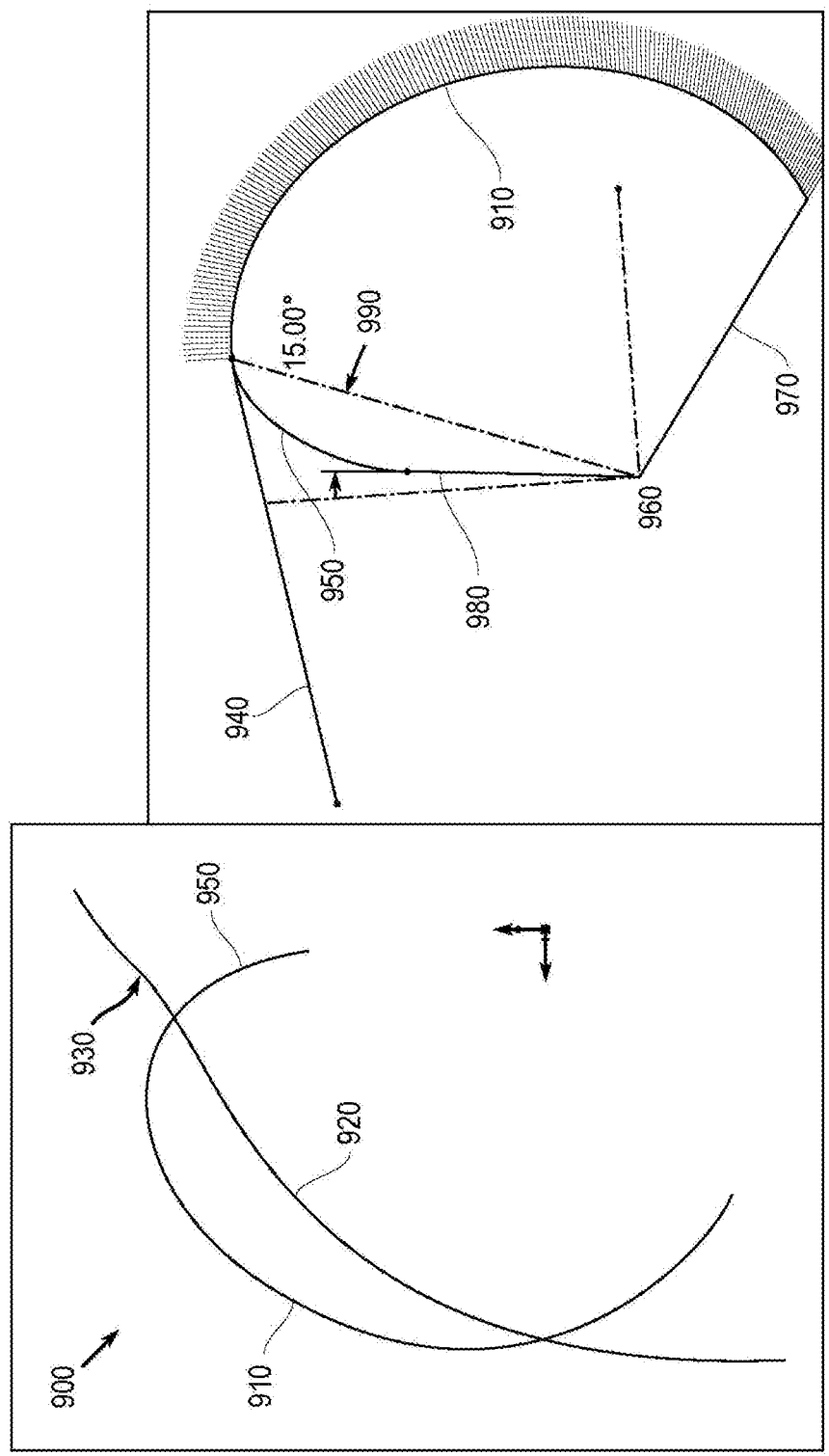
FIG. 9 is a graphical view of torque variation with elevation.

FIG. 9 shows a graphical view 900 of resulting pitch lines: inner 910 and outer 920 for a non-circular gear pair. There are two issues with these pitch lines. The first issue involves the outer more oblique line 920 having a concavity 930 at which the center of curvature becomes inverted. Concavity can be tolerated when gear teeth are small compared to radius, but as they get larger the synthesis of the tooth form can break down. The second issue is the inner more acute line 910 starts to approach the center of rotation. This renders the result difficult to use in this or other designs. These effects occur when the weight torque starts to approach zero.

Because $r_2$ (as distal radius-2) is a function of $r_1$ (as proximal radius-1), the solution to the pitch lines is to select a point just prior to concavity 930 on the complimentary distal gear 250 and project a tangent line 940 outward from the inner line 910. The pitch line of distal gear 250 is recalculated without its loopback 950 beyond the outer pitch line 920. A focal point 960 connects a first radial line 970 to the inner line 910, as well as a second radial line 980 tangent the loopback 950 to form an angle 990 with the intersection of the tangent line 940 and the focal point 960.

There are equations that approximate the tooth form very well for a normal circular gear, but for noncircular gears, the tooth form varies depending on the local curvature. There are two methods to generate noncircular gear teeth 350 and 370. The first is to take the shape of a rack with the desired pressure angle and diametric pitch and "roll" the noncircular gear across the cutting pitch line to the noncircular pitch line, enabling the rack teeth to cut away at the noncircular gear. The second method is very similar but uses a circular gear with the proper pressure angle and diametric pitch to "roll" along the noncircular gear.

Figure 10:
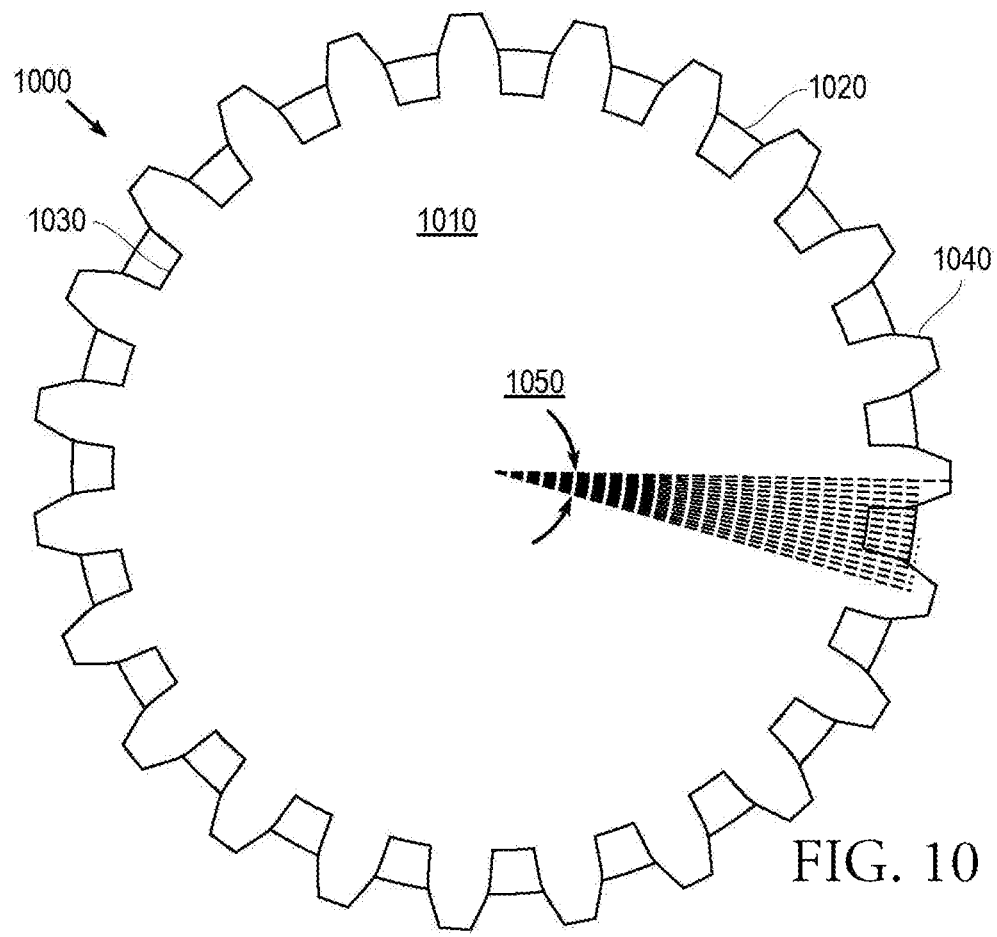
FIG. 10 is a graphical view of a pitch line geometries.

FIG. 10 shows a graphical view 1000 of the circular cutting gear 1010 using the second method for this design. This cutting gear 1010 features a pitch circle 1020, a root circumference 1030, an angularly disposed array of teeth 1040 separated by an angle 1050. A dedendum denotes the gap between teeth 1040 from the root 1030 to the pitch circle 1020, while an addendum denotes the region between the pitch circle 1020 and the radial tip of the teeth 1040.

The first step generates the circular gear 1010 to cut the tooth form. In this case, a pressure angle of 20° and a diametric pitch of two were used. Because this circular cutting gear 1010 is used to cut the teeth of a noncircular gear, the addendum of the cutting gear 1010 equals the desired dedendum of the noncircular gear. Similarly, the dedendum of the cutting gear 1010 equals the noncircular gear addendum.

The cutting gear 1010 attaches to the noncircular gear, either proximal 240 gear or distal 250 gear, by their respective pitch lines and a cut is performed. The cutting gear 1010 is rolled by a small amount along the noncircular gear and the cut is repeated. The cutting gear 1010 rotates and translates to properly track the same arc length along both its own pitch circle 1020 and that of the noncircular gear, as if rolling along the surface without slipping. This process is repeated over three-hundred times per gear until the tooth form of the noncircular gears 240 or 250 is all that remains.

Figure 11:
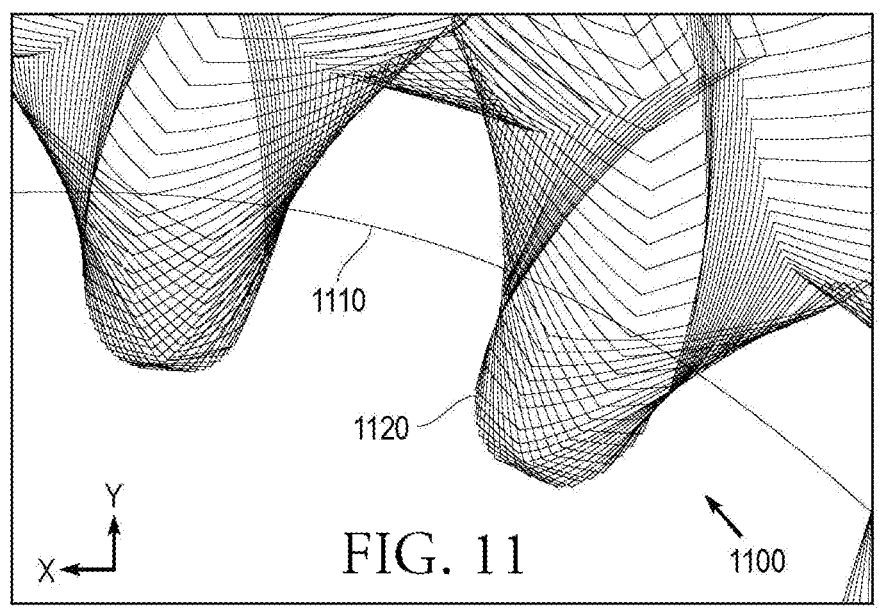
FIG. 11 is a graphical view of a circular cutting gear.

FIG. 11 shows a graphical view 1100 of an iteratively cut gear tooth form along a pitch line 1110 by the overlay of the individual cuts 1120. The clocking of the initial cut on the distal gear 250 must be complimentary of the initial cut of the proximal gear 240. Because these gears only mesh at a single point on both noncircular gears and cannot mesh at any other location, care is taken to ensure a tooth 350 or 370 on one gear aligns with a space on the opposing gear.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. A method for producing first and second non-circular gears to balance counteracting gravity induced torque and a torsion equilibrator spring across an elevation range, said method comprising:

assigning a radial sum for both pitch radii of the first and second non-circular gears;

calculating a torque for both the non-circular gears for an elevation angle within the elevation range;

calculating a first pitch radius of the first non-circular gear by the gravity induced torque and the torsion equilibrator spring for said elevation angle;

calculating a second pitch radius of the second non-circular gear by subtracting said first pitch radius from said radial sum for said elevation angle;

repeating said calculating operations for a plurality of elevation angles across the elevation range;

producing first and second profiles corresponding to said first and second pitch radii along said plurality of elevation angles; and fabricating the non-circular gears based on said first and second profiles.

2. The method according to claim 1, wherein said first pitch radius is calculated from:

$$r_1 = \frac{Wd\cos\theta_1}{k(P-\theta_2)} \frac{C}{1 + \frac{Wd\cos\theta_1}{k(P-\theta_2)}},$$

where $r_1$ is said first pitch radius, C is said radial sum, W and d are weight and moment distance for the gravity induced torque, $\theta_1$ is said elevation angle, $\theta_2$ is twist angle, k is spring constant for the torsion equilibrator and P is a preload angle for the torsion equilibrator spring.

3. The method according to claim 1, wherein the non-circular gears are composed of stainless steel.

4. The method according to claim 1, wherein a circular gear cuts one of the non-circular gears for said fabricating operation.

* * * * *